United States Patent
Oh et al.

(10) Patent No.: US 10,490,619 B2
(45) Date of Patent: Nov. 26, 2019

(54) MANUFACTURING METHOD OF ORGANIC LIGHT EMITTING DIODE DISPLAY DEVICE WITH FIRST AND SECOND DRIVING VOLTAGE LINES

(71) Applicant: Samsung Display Co., Ltd., Yongin-si, Gyeonggi-do (KR)

(72) Inventors: Eun-Hye Oh, Busan (KR); Eui Hoon Hwang, Asan-si (KR); Soon O Jung, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/959,114

(22) Filed: Apr. 20, 2018

(65) Prior Publication Data

US 2018/0240857 A1   Aug. 23, 2018

Related U.S. Application Data

(63) Continuation of application No. 14/686,700, filed on Apr. 14, 2015, now Pat. No. 9,954,048.

(30) Foreign Application Priority Data

Sep. 17, 2014  (KR) .......................... 10-2014-0123457

(51) Int. Cl.
  *H01L 27/32* (2006.01)
  *G09G 3/3233* (2016.01)
(52) U.S. Cl.
  CPC ....... *H01L 27/3276* (2013.01); *G09G 3/3233* (2013.01); *H01L 27/3262* (2013.01);
  (Continued)

(58) Field of Classification Search
  CPC .................................................. H01L 27/3276
  See application file for complete search history.

(56) References Cited

U.S. PATENT DOCUMENTS

| 6,593,592 B1 * | 7/2003 | Yamazaki | ........... H01L 27/1237 257/59 |
| 2001/0011868 A1 | 8/2001 | Fukunaga et al. | |

(Continued)

FOREIGN PATENT DOCUMENTS

| KR | 10-0297868 B1 | 10/2001 |
| KR | 10-0484591 B1 | 4/2005 |

(Continued)

*Primary Examiner* — Lex H Malsawma
*Assistant Examiner* — Laura M Dykes
(74) *Attorney, Agent, or Firm* — Lewis Roca Rothgerber Christie LLP

(57) ABSTRACT

An organic light emitting display device includes: a substrate; a semiconductor on the substrate and including a switching channel of a switching transistor and a driving channel of a driving transistor, wherein the switching transistor and the driving transistor are spaced; a first insulating layer covering the semiconductor; a switching gate electrode on the first insulating layer and overlapped with the switching channel and a driving gate electrode on the first insulating layer and overlapped with the driving channel; a second insulating layer covering the switching gate electrode and the driving gate electrode; a data line on the second insulating layer and configured to transmit a data signal, a driving voltage line on the second insulating layer and configured to transmit a driving voltage; a passivation layer; a pixel electrode on the passivation layer; and a pixel connecting member on the passivation layer.

5 Claims, 15 Drawing Sheets

(52) U.S. Cl.
CPC . *H01L 27/3265* (2013.01); *G09G 2300/0426* (2013.01); *G09G 2300/0819* (2013.01); *G09G 2300/0842* (2013.01); *G09G 2300/0861* (2013.01); *G09G 2320/0238* (2013.01)

(56) References Cited

U.S. PATENT DOCUMENTS

| | | | |
|---|---|---|---|
| 2002/0004260 A1* | 1/2002 | Furuta | H01L 29/66757 438/149 |
| 2003/0214006 A1 | 11/2003 | Nakamura et al. | |
| 2004/0256997 A1* | 12/2004 | Fukumoto | G09G 3/3233 315/169.1 |
| 2006/0061525 A1 | 3/2006 | Kim et al. | |
| 2006/0202934 A1 | 9/2006 | Shin et al. | |
| 2008/0035931 A1 | 2/2008 | Kwak et al. | |
| 2011/0128211 A1 | 6/2011 | Ono | |

FOREIGN PATENT DOCUMENTS

| | | |
|---|---|---|
| KR | 10-2009-0058283 A | 6/2009 |
| KR | 10-2011-0006812 A | 1/2011 |

\* cited by examiner

MANUFACTURING METHOD OF ORGANIC LIGHT EMITTING DIODE DISPLAY DEVICE WITH FIRST AND SECOND DRIVING VOLTAGE LINES

CROSS-REFERENCE TO RELATED APPLICATION

This application is a divisional of U.S. patent application Ser. No. 14/686,700, filed Apr. 14, 2015, which claims priority to and the benefit of Korean Patent Application No. 10-2014-0123457, filed Sep. 17, 2014, the entire content of both of which is incorporated herein by reference.

BACKGROUND

1. Field

Embodiments of the present disclosure relate to an organic light emitting device and a method for manufacturing the same.

2. Description of the Related Art

An organic light emitting diode includes two electrodes and an organic emission layer positioned therebetween. Electrons injected from one electrode and holes injected from the other electrode are coupled with each other in the organic emission layer to generate excitons, and the excitons emit energy to emit light.

An organic light emitting diode display device (or an organic light emitting diode display) includes a plurality of pixels, each pixel including an organic light emitting diode which is a self-emission device, a plurality of thin film transistors for driving the organic light emitting diode and at least one storage capacitor. The plurality of thin film transistors include at least a switching thin film transistor and a driving thin film transistor.

As described, a plurality of transistors and a capacitor are formed in one pixel, an organic emission layer is also formed on the transistors and the capacitor in the organic light emitting diode display device, and thus many masks are used. However, the cost for one mask is very high, thereby causing an increase in manufacturing cost.

The above information disclosed in this Background section is only for enhancement of understanding of the background of the disclosure and therefore it may contain information that does not form present invention prior art.

SUMMARY

Embodiments of the present disclosure may provide an organic light emitting display device with reduced manufacturing cost (e.g., by using at least one less mask by changing a pixel structure, and a manufacturing method thereof).

An organic light emitting display device according to an exemplary embodiment of the present disclosure includes: a substrate; a semiconductor on the substrate and including a switching channel of a switching transistor and a driving channel of a driving transistor, wherein the switching transistor and the driving transistor are spaced from each other; a first insulating layer covering the semiconductor; a switching gate electrode on the first insulating layer and overlapped with the switching channel; a driving gate electrode on the first insulating layer and overlapped with the driving channel; a second insulating layer covering the switching gate electrode and the driving gate electrode; a data line on the second insulating layer and configured to transmit a data signal, the data line including an upper data line and a lower data line; a driving voltage line on the second insulating layer and configured to transmit a driving voltage, the driving voltage line comprising a first driving voltage line that is parallel with the data line and a second driving voltage line that crosses the data line; a passivation layer covering the data line and the driving voltage line; a pixel electrode on the passivation layer; and a pixel connecting member on the passivation layer and connecting the upper data line and the lower data line to each other, wherein the data line is divided into the upper data line and the lower data line at a crossing portion that crosses the second driving voltage line.

The organic light emitting display device may further include a storage capacitor overlapping the driving gate electrode, the storage capacitor may include: a first storage capacitor plate, which is the driving gate electrode; and a second storage capacitor plate overlapping the first storage capacitor plate and on the second insulating layer.

The second storage capacitor plate may be an expanded area of the first driving voltage line.

The driving channel may include at least one curved portion.

The second storage capacitor plate may be at the same layer as the second driving voltage line and the data line.

The organic light emitting display device according to the exemplary embodiment of the present disclosure may further include: a scan line connected with the switching gate electrode and configured to transmit a scan signal; a compensation transistor including a compensation gate electrode, which is a part of the scan line, a compensation source electrode in the semiconductor, and a compensation drain electrode; and a first data connecting member at the same layer as the data line and connecting the driving gate electrode and the compensation drain electrode.

The organic light emitting display device according to the exemplary embodiment of the present disclosure may further include: a previous scan line at the same layer as the scan line and configured to transmit a previous scan signal; an initialization voltage line at the same layer as the pixel electrode and configured to transmit an initialization voltage; an initialization transistor including an initialization gate electrode, which is a part of the previous scan line, an initialization source electrode in the semiconductor, and an initialization drain electrode; and a second data connecting member at the same layer as the data line and connecting the initialization drain electrode and the initialization voltage line.

The organic light emitting display device according to the exemplary embodiment of the present disclosure may further include: a light emission control line at the same layer as the scan line and configured to transmit a light emission control signal; a light emission control transistor including a light emission control gate electrode, which is a part of the light emission control line, a light emission control source electrode in the semiconductor, and a light emission control drain electrode; and a third data connecting member at the same layer as the data line and connecting the light emission control drain electrode and the pixel electrode.

The organic light emitting display device according to the exemplary embodiment of the present disclosure may further include: an organic emission layer on the pixel electrode; and a common electrode covering the organic emission layer.

The data line and the driving voltage line are formed of a triple-layer of titanium/aluminum/titanium (Ti/Al/Ti).

Another exemplary embodiment of the present disclosure provides a method for manufacturing an organic light emitting display device. The method includes: forming a semiconductor on a substrate; forming a first insulating layer on the semiconductor; forming a driving gate electrode of a driving transistor and a switching gate electrode of a switching transistor on the first insulating layer; forming a driving channel and a switching channel respectively in the semiconductor provided below the driving gate electrode and the switching gate electrode by performing a doping process; forming a second insulating layer covering the driving gate electrode and the switching gate electrode; forming a data line including an upper data line and a lower data line that is spaced from the upper data line, a first driving voltage line that is parallel with the data line, and a second driving voltage line that crosses the data line on the second insulating layer; forming a passivation layer covering the data line, the first driving voltage line, and the second driving voltage line; and forming a pixel electrode and a pixel connecting member on the passivation layer, wherein the pixel connecting member may connect the upper data line and the lower data line to each other.

A storage capacitor may be in an area where the driving gate electrode and an expanded area of the first driving voltage line overlap each other.

The driving channel may include at least one curved portion.

Damage to an interface between the semiconductor and the first insulating layer is eliminated by performing a dopant activation process to the semiconductor after forming the second insulating layer.

The method may further include forming an organic emission layer on the pixel electrode; and forming a common electrode on the organic emission layer.

According to the exemplary embodiment of the present disclosure, the second storage capacitor plate is formed of the same material and at the same layer as the driving voltage line and the data line so that at least one mask can be eliminated in the manufacturing process.

In addition, since the second storage capacitor plate, the driving voltage line, and the data line are at the same layer, an additional insulating layer for insulation between the second storage capacitor plate and the driving voltage line and data line is not needed, and a short-circuit between the second storage capacitor plate and the driving voltage line and data line can be fundamentally or substantially prevented.

DETAILED DESCRIPTION

Figure 1:
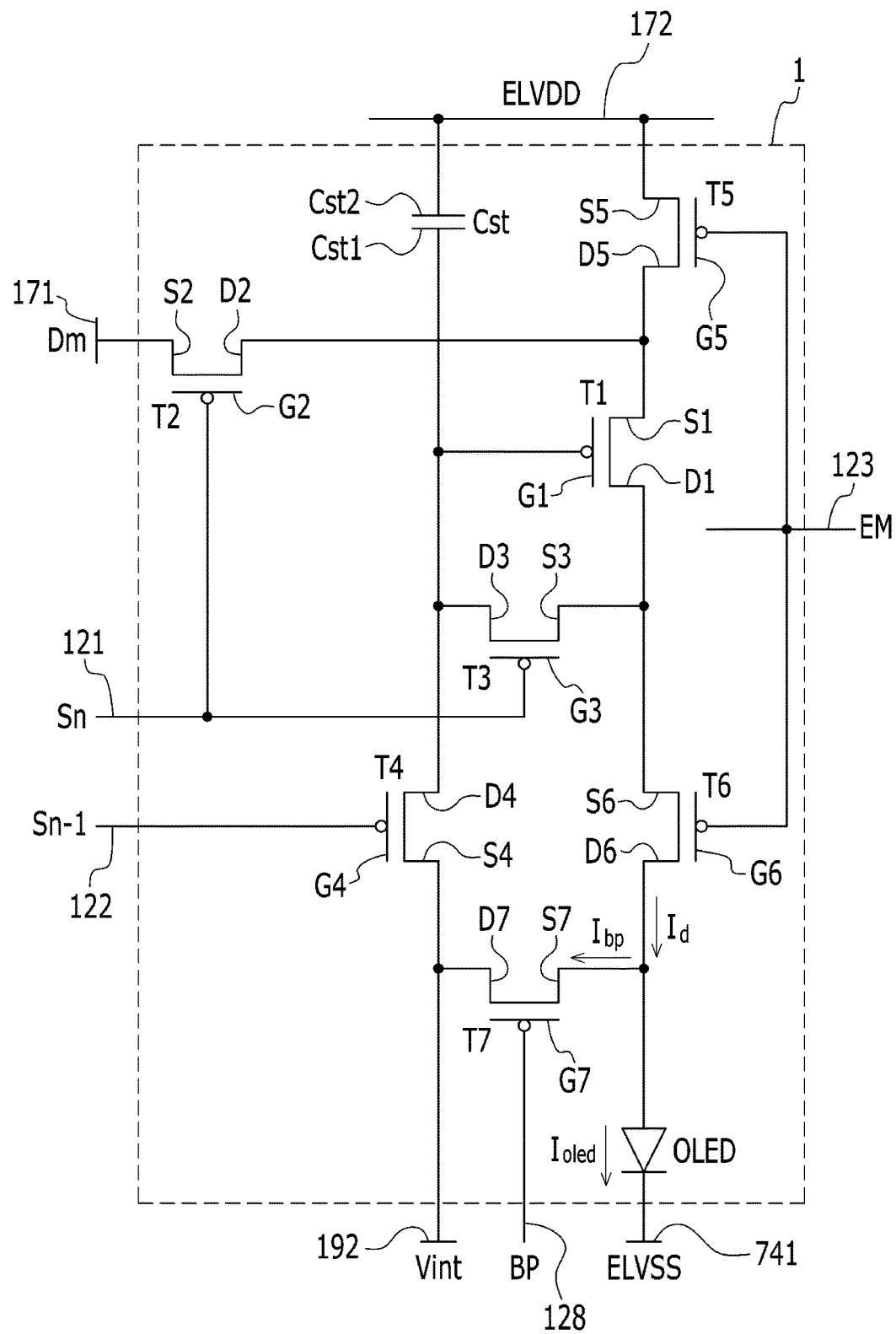
FIG. 1 is an equivalent circuit diagram of an organic light emitting display device according to an exemplary embodiment of the present disclosure.

Embodiments of the present disclosure will be described more fully hereinafter with reference to the accompanying drawings, in which exemplary embodiments of the present disclosure are shown. As those skilled in the art would realize, the described embodiments may be modified in various different ways, all without departing from the spirit or scope of the present disclosure.

The drawings and description are to be regarded as illustrative in nature and not restrictive or limiting. Like reference numerals designate like elements throughout the specification.

Further, the size and thickness of each configuration shown in the drawings are arbitrarily shown for better understanding and ease of description, but the present disclosure is not limited thereto.

In the drawings, the thickness of layers, films, panels, regions, etc., are exaggerated for clarity. In the drawings, for better understanding and ease of description, the thickness of some layers and areas is exaggerated. It will be understood that when an element such as a layer, film, region, or substrate is referred to as being "on" another element, it can be directly on the other element or intervening elements may also be present.

The terminology used herein is for the purpose of describing particular embodiments only and is not intended to be limiting of the inventive concept. As used herein, the singular forms "a" and "an" are intended to include the plural forms as well, unless the context clearly indicates otherwise.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and/or the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on," "connected to," "coupled to," "connected with," "coupled with," or "adjacent to" another element or layer, it can be directly on, connected to, coupled to, connected with, coupled with, or adjacent to the other element or layer, or one or more intervening elements or layers may be present. In contrast, when an element or layer is referred to as being "directly on," "directly connected to," "directly coupled to," "directly connected with," "directly coupled with," or "immediately adjacent to" another element or layer, there are no intervening elements or layers present.

In addition, unless explicitly described to the contrary, the word "comprise" and variations such as "comprises" or "comprising" will be understood to imply the inclusion of stated elements but not the exclusion of any other elements. Further, in the specification, the word "on" means positioning on or below the object portion, and does not essentially mean positioning on the upper side of the object portion based on a gravity direction.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Further, in this specification, the word "on a plane" means viewing a target portion from the top, and the word "on a cross-section" means viewing a cross-section formed by vertically cutting a target portion from the side.

An organic light emitting display device according to an exemplary embodiment of the present disclosure will be described with reference to FIG. 1 through FIG. 6.

FIG. 1 is an equivalent circuit diagram of one pixel of the organic light emitting display device according to the exemplary embodiment of the present disclosure.

As shown in FIG. 1, one pixel 1 of the organic light emitting display device according to the exemplary embodiment of the present disclosure includes a plurality of signal lines 121, 122, 123, 128, 171, 172, and 192, a plurality of transistors T1, T2, T3, T4, T5, T6, and T7 connected to the plurality of signal lines, a storage capacitor Cst, and an organic light emitting diode OLED.

The transistors T1, T2, T3, T4, T5, T6, and T7 include a driving transistor T1, a switching transistor T2, a compensation transistor T3, an initialization transistor T4, an operation control transistor T5, a light emission control transistor T6, and a bypass transistor T7.

The signal lines 121, 122, 123, 128, 171, 172, and 192 include a scan line 121 transmitting a scan signal Sn, a previous scan line 122 transmitting a previous scan signal Sn-1, an emission control line 123 transmitting an emission control signal EM to the operation control transistor T5 and the light emission control transistor T6, a bypass control line 128 transmitting a bypass signal BP to the bypass transistor T7, a data line 171 overlaying the scan line 121 and transmitting a data signal Dm, a driving voltage line 172 transmitting the driving voltage ELVDD and formed almost in parallel (e.g., substantially parallel) with the data line 171, and an initialization voltage line 192 transmitting an initialization voltage Vint that initializes the driving transistor T1.

A gate electrode G1 of the driving transistor T1 is connected with one end Cst1 of the storage capacitor Cst, a source electrode S1 of the driving transistor T1 is connected with the driving voltage line 172 via the operation control transistor T5, and a drain electrode D1 of the driving transistor T1 is electrically connected with an anode of the organic light emitting diode ILED via the light emission control transistor T6. The driving transistor T1 receives the data signal Dm and transmits a driving current Id to the organic light emitting diode OLED according to a switching operation of the switching transistor T2.

A gate electrode G2 of the switching transistor T2 is connected with the scan line 121, a source electrode S2 of the switching transistor T2 is connected with the data line 171, and a drain electrode D2 of the switching transistor T2 is connected with the source electrode S1 of the driving transistor T1 and with the driving voltage line 172 via the operation control transistor T5. Such a switching transistor T2 is turned on by a scan signal Sn transmitted through the scan line 121, and performs a switching operation for transmission of a data signal Dm transmitted to the data line 171 to the source electrode S1 of the driving transistor T1.

A gate electrode G3 of the compensation transistor T3 is connected to the scan line 121, a source electrode S3 of the compensation transistor T3 is connected with the drain electrode D1 of the driving transistor T1 and connected with an anode of the organic light emitting diode OLED via the light emission control transistor T6, and a drain electrode D3 of the compensation transistor T3 is connected to a drain electrode D4 of the initialization transistor T4, a first end Cst1 of the storage capacitor Cst, and the gate electrode g1 of the driving transistor T1. Such a compensation transistor T3 is turned on according to the scan signal Sn transmitted through the scan line 121 and diode-connects the driving transistor T1 by connecting the gate electrode G1 and the drain electrode D1 of the driving transistor T1 to each other.

A gate electrode G4 of the initialization transistor T4 is connected with the previous scan line 122, a source electrode S4 of the initialization transistor T4 is connected with the initialization voltage line 192, and a drain electrode D4 of the initialization transistor T4 is connected with the first end Cst1 of the storage capacitor Cst and the gate electrode G1 of the driving transistor T1 through the drain electrode D3 of the compensation transistor T3. Such an initialization transistor T4 is turned on according to the previous scan signal Sn-1 transmitted through the previous scan line 122, and performs an initialization operation for initialization of a gate voltage of the gate electrode G1 of the driving transistor T1 by transmitting the initialization voltage Vint to the gate electrode G1 of the driving transistor T1.

A gate electrode G5 of the operation control transistor T5 is connected with the light emission control line 123, a source electrode S5 of operation control transistor T5 is connected with the driving voltage line 172, and a drain electrode D5 of the operation control transistor T5 is connected with the source electrode S1 of the driving transistor T1 and the drain electrode S2 of the switching transistor T2.

A gate electrode G6 of the light emission control transistor T6 is connected with the light emission control line 123, a source electrode S6 of the light emission control transistor T6 is connected with the drain electrode D1 of the driving transistor T1 and the source electrode S3 of the compensation transistor T3, and a drain electrode D6 of the light emission control transistor T6 is electrically connected with the anode of the organic light emitting diode OLED. The operation control transistor T5 and the light emission control transistor T6 are concurrently (e.g., simultaneously) turned on according to a light emission control signal EM transmitted through the light emission control line 123 such that the driving voltage ELVDD is compensated through the diode-connected driving transistor T1 and thus transmitted to the organic light emitting diode OLED.

A gate electrode G7 of the bypass transistor T7 is connected with the bypass control line 128, a source electrode S7 of the bypass transistor T7 is connected with the drain electrode D6 of the light emission control transistor T6 and the anode of the organic light emitting diode OLED, and a drain electrode D7 of the bypass transistor T7 is connected with the initialization voltage line 192 and the source electrode S4 of the initialization transistor T4.

A second end Cst2 of the storage capacitor Cst is connected with the driving voltage line 172, and a cathode of the organic light emitting diode OLED is connected with a common voltage line 741 that transmits a common voltage ELVSS.

Hereinafter, an operation process of one pixel of the organic light emitting display device according to the exemplary embodiment of the present disclosure will be described in detail with reference to FIG. 2.

First, a low-level previous scan signal Sn-1 is supplied through the previous scan line 122 during an initialization period. Then, the initialization transistor T4 is turned on corresponding to the low-level previous scan signal Sn-1, and the initialization voltage Vint is connected to the gate electrode G1 of the driving transistor T1 through the initialization transistor T4 such that the driving transistor T1 is initialized through the initialization voltage Vint.

Next, a low-level scan signal Sn is supplied through the scan line 121 during a data programming period. Then, the switching transistor T2 and the compensation transistor T3 are turned on corresponding to the low-level scan signal Sn. As such, the driving transistor T1 is diode-connected by the turned-on compensation transistor T3 and thus biased in a forward direction.

Then, a compensation voltage Dm+Vth (Vth is a negative (−) value) reduced by a threshold voltage Vth of the driving transistor T1 from the data signal Dm supplied from the data line 171 is applied to the gate electrode G1 of the driving transistor T1. The driving voltage ELVDD and the compensation voltage (Dm+Vth) are applied to respective ends of the storage capacitor Cst, and a charge corresponding to a voltage difference between respective ends is stored in the storage capacitor Cst.

After that, the light emission control signal EM supplied from the light emission control line 123 is changed to a low level from a high level during a light emission period. Then, the operation control transistor T5 and the light emission control transistor T6 are turned on by the low-level light emission control signal EM during the light emission period.

Then, a driving current Id is generated according to a voltage difference between the voltage of the gate electrode G1 of the driving transistor T1 and the driving voltage ELVDD, and the driving current Id is supplied to the organic light emitting diode OLED through the emission control transistor T6. A gate-source voltage Vgs of the driving transistor T1 is maintained with (Dm+Vth)-ELVDD by the storage capacitor Cst during the light emission period, and the driving current Id is proportional to the square $(Dm-ELVDD)^2$ of a value obtained by subtracting the threshold voltage from the source-gate voltage Vgs according to a current-voltage relationship of the driving transistor T1. Thus, the driving current Id is determined regardless of the threshold voltage Vth of the driving transistor T1.

The bypass transistor T7 receives a bypass signal BP from the bypass control line 128. The bypass signal BP is a voltage having a level (e.g., a predetermined level) which always turns off the bypass transistor T7, the bypass transistor T7 receives a voltage having a transistor off level from the gate electrode G7, and thus the bypass transistor T7 is always turned off, and a part of the driving current Id flows out through the bypass thin film transistor T7 as a bypass current Ibp in the off state.

Although a small current (e.g., a minimum current) may flow through the driving transistor T1 when a black image is to be displayed, a black image may not be properly displayed if the organic light emitting diode OLED emits light. Thus, the bypass transistor T7 of the organic light emitting display device according to the exemplary embodiment of the present disclosure may disperse a part of the small current of the driving transistor T1 to current paths other than a current path toward the organic light emitting diode OLED as a bypass current Ibp. Here, the small current of the driving transistor T1 implies a current under a condition that the transistor T1 is turned off because the gate-source voltage Vgs of the driving transistor T1 is lower than the threshold voltage Vth. A small driving current (e.g., a current lower than 10 pA) under the condition that turns off the driving transistor T1 is transmitted to the organic light emitting diode OLED such that an image is displayed with black luminance (i.e., displayed as a black image). When the small driving current that displays the black image flows, an influence of bypass transmission of the bypass current Ibp is high, but when a high driving current that displays an image such as a general image or a white image flows, the bypass current Ibp has almost no influence. Thus, when the driving current for displaying the black image flows, a light emission current Ioled is reduced by an amount of the bypass current Ibp that leaked through the bypass transistor T7 from the driving current Id, and the light emission current Ioled has a small amount of current for clear representation of the black image. Therefore, an image having precise black luminance (i.e., having a precise black image) may be realized using the bypass transistor T7, thereby improving a contrast ratio.

Figure 2:
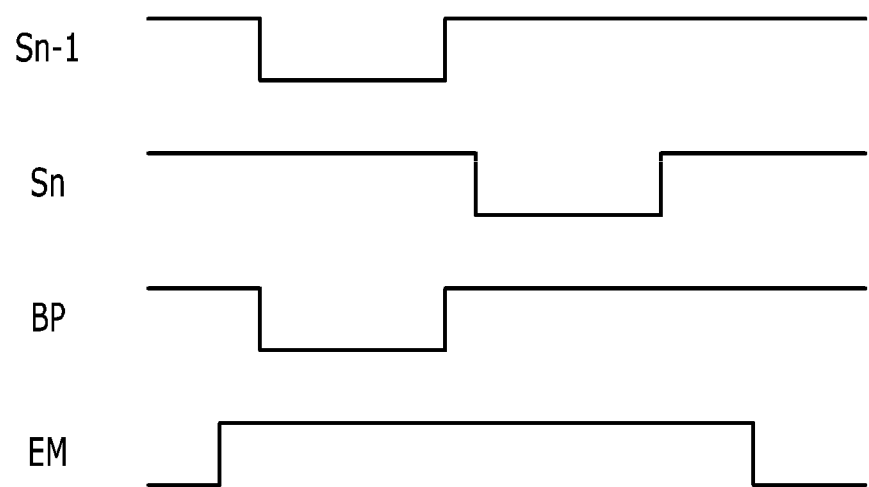
FIG. 2 is a timing diagram of a signal applied to one pixel of the organic light emitting display device according to the exemplary embodiment of the present disclosure.

In FIG. 2, the bypass signal BP is equivalent to the previous scan signal Sn-1, but the present invention is not limited thereto. In addition, in the exemplary embodiment of the present disclosure, a seven transistor-one capacitor structure is illustrated, but the present disclosure is not limited thereto.

Now, a detailed structure of the pixel of the organic light emitting display device shown in FIG. 1 will be described in detail with reference to FIG. 3 through FIG. 6, together with FIG. 1.

Figure 3:
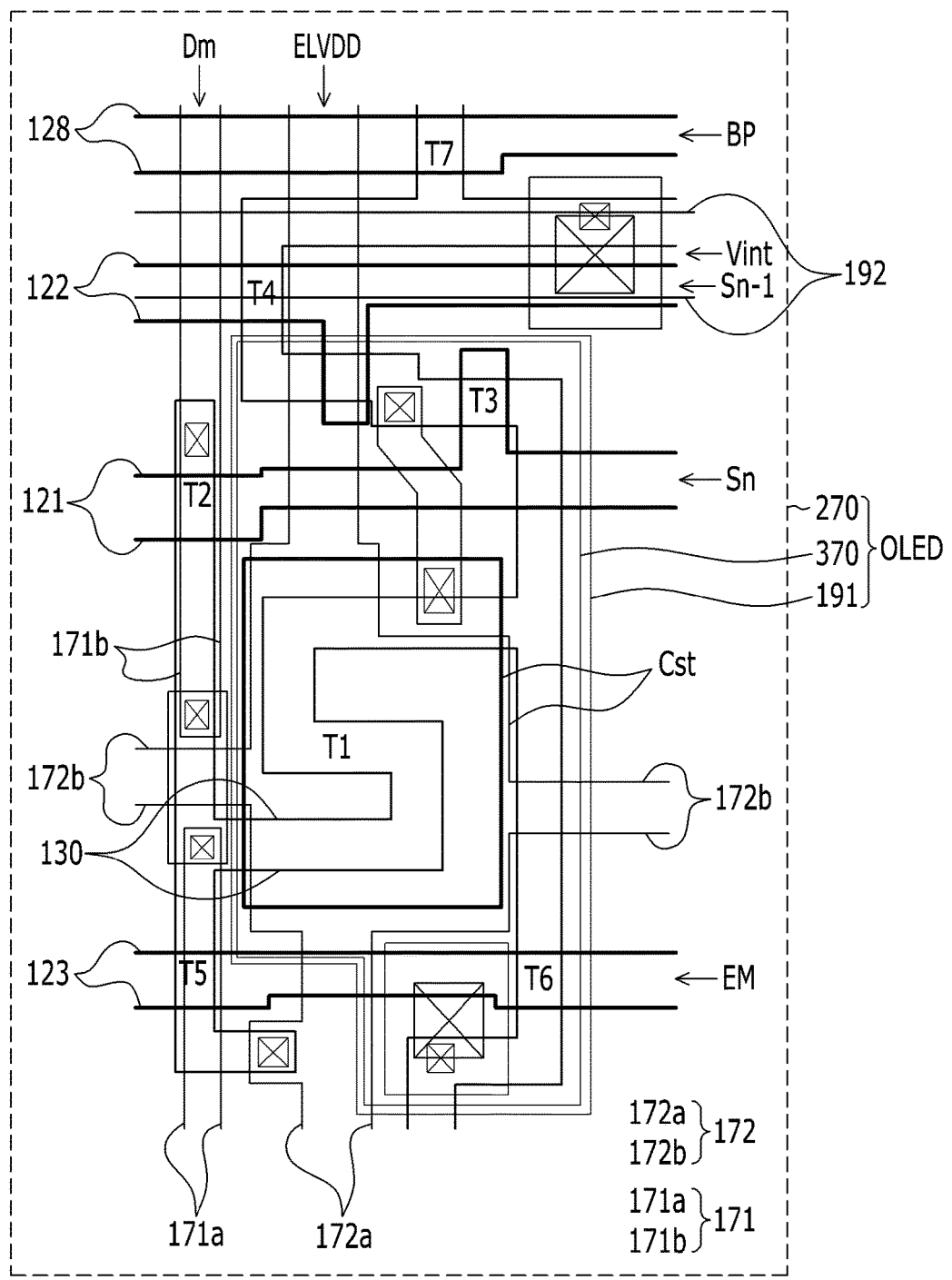
FIG. 3 schematically illustrates a plurality of transistors and a capacitor of the organic light emitting display device according to the exemplary embodiment of the present disclosure.
Figure 4:
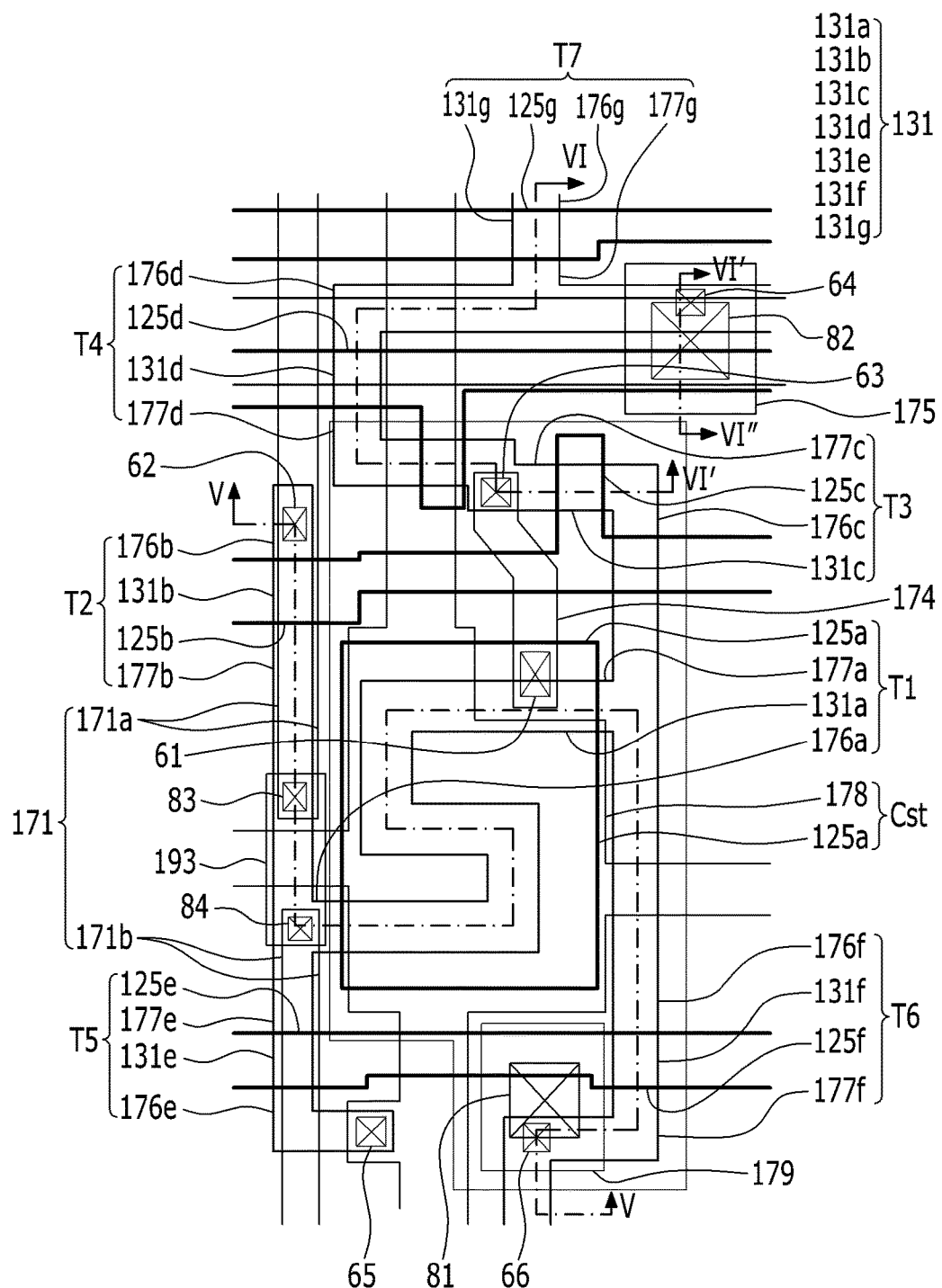
FIG. 4 is a detailed layout view of FIG. 3.
Figure 5:
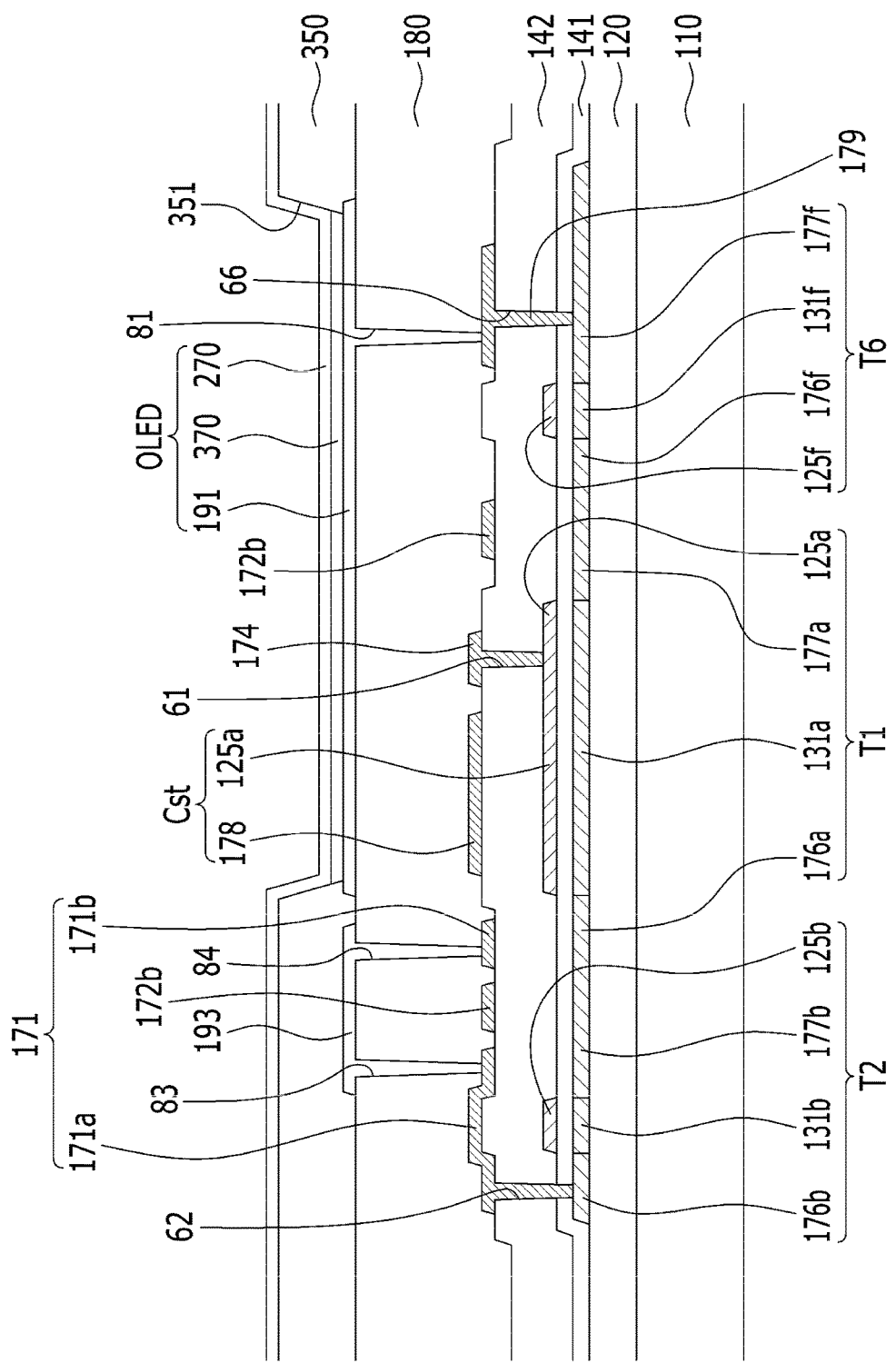
FIG. 5 is a cross-sectional view of the organic light emitting display device of FIG. 4, taken along the line V-V.
Figure 6:
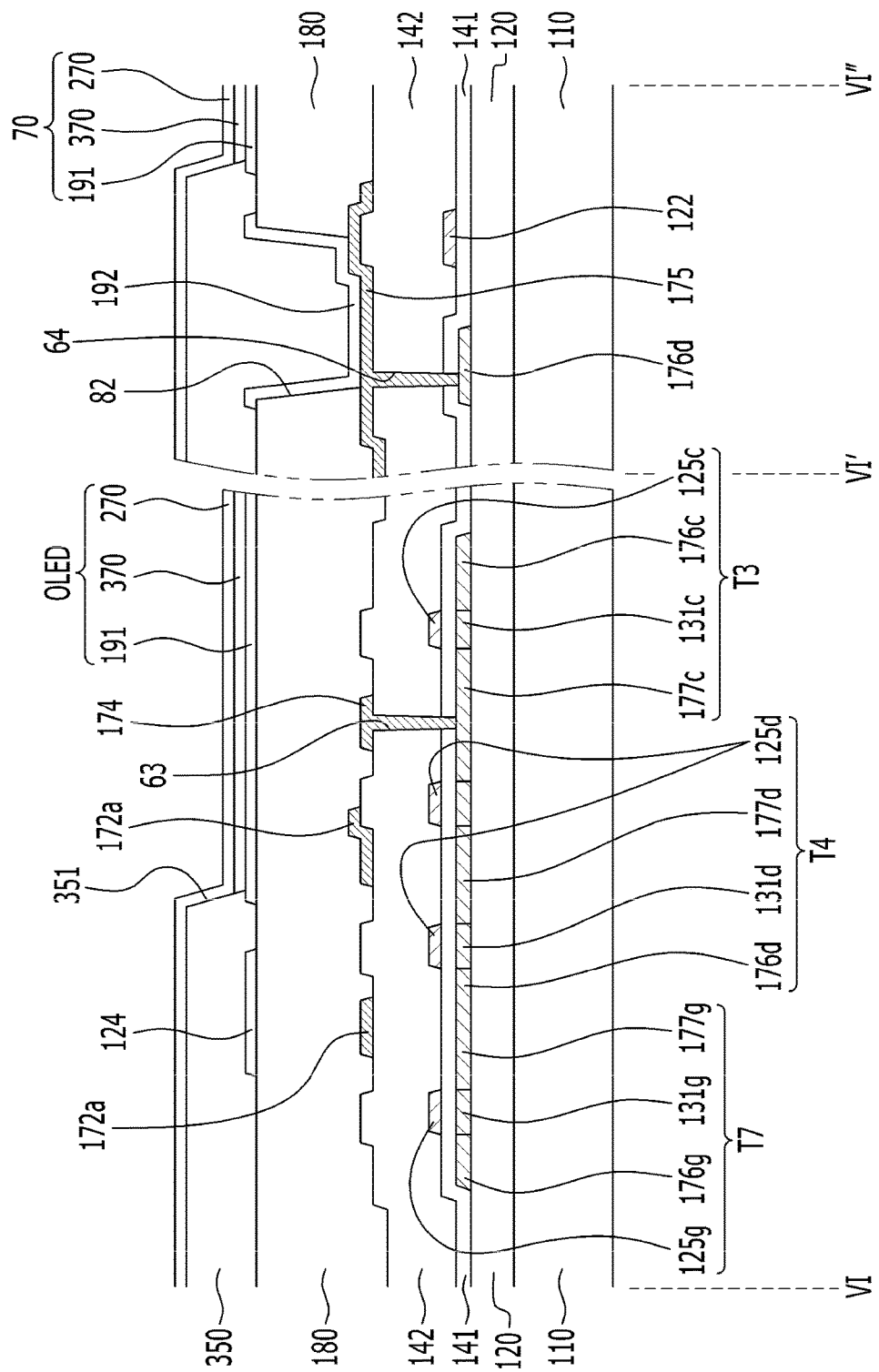
FIG. 6 is a cross-sectional view of the organic light emitting display device of FIG. 4, taken along the lines VI-VI' and VI'-VI".

FIG. 3 is a schematic diagram of the plurality of transistors and capacitors of the organic light emitting display device according to an exemplary embodiment of the present disclosure, FIG. 4 is a detailed layout view of FIG. 3, FIG. 5 is a cross-sectional view of the organic light emitting display device shown in FIG. 4, taken along the line V-V, and FIG. 6 is a cross-sectional view of the organic light emitting display device of FIG. 4, taken along the line VI-VI'.

Hereinafter, a detailed planar structure of the organic light emitting diode display according to the exemplary embodiment of the present disclosure will be first described in detail with reference to FIGS. 3 and 4, and a detailed cross-sectional structure will be described in detail with reference to FIG. 5 and FIG. 6.

First, as shown in FIG. 3, the organic light emitting display device according to the exemplary embodiment of the present disclosure includes the scan line 121, the previous scan line 122, the light emission control line 123, and the bypass control line 128 respectively applying the scan signal Sn, the previous scan signal Sn-1, the light emission control signal EM, and the bypass signal BP. The scan line 121, the previous scan line 122, the light emission control line 123, and the bypass control line 128 extend in a row direction. The organic light emitting display device further includes the data line 171 and the driving voltage line 172 crossing the scan line 121, the previous scan line 122, the light emission control line 123, and the bypass control line 128 and respectively applying the data signal Dm and the driving voltage ELVDD to the pixel. The initialization voltage Vint is transmitted to the compensation transistor T3 through the initialization voltage line 192. The driving voltage line 172 is formed of a first driving voltage line 172a that is parallel with the data line 171 and a second driving voltage line 172b that is parallel with the scan line 121. The first driving voltage line 172a and the second driving voltage line 172b are electrically connected to each other.

In addition, a pixel circuit and an organic light emitting diode OLED are formed of the driving transistor T1, the switching transistor T2, the compensation transistor T3, the initialization transistor T4, the operation control transistor T5, the light emission control transistor T6, the bypass transistor T7, the storage capacitor Cst, a pixel electrode 191, an organic emission layer 370, and a common electrode 270 in the pixel.

Each channel of the driving transistor T1, the switching transistor T2, the compensation transistor T3, the initialization transistor T4, the operation control transistor T5, the light emission control transistor T6, and the bypass transistor T7 is formed in one semiconductor 130 connected (i.e., constituting channel regions of these transistor) thereto, and the semiconductor 130 is formed by being bent in various suitable shapes. Such a semiconductor 130 may be formed of a polycrystalline material or an oxide semiconductor material. The oxide semiconductor material may include one or more of titanium (Ti), hafnium (Hf), zirconium (Zr), aluminum (Al), tantalum (Ta), germanium (Ge), zinc (Zn), gallium (Ga), tin (Sn), or indium (In), or zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O), which are complex oxides thereof. When the semiconductor 130 is formed of the oxide semiconductor material, an additional protection layer may be provided for protection of the oxide semiconductor material that is weak to an external environment such as a high temperature and/or the like.

The semiconductor 130 includes a channel region in which a channel is doped with an N-type impurity or a P-type impurity, and a source region and a drain region which are formed at respective sides of the channel region by doping the doping impurity which is an opposite type to the doping impurity doped in the channel region. In the present exemplary embodiment, the source doping region and the drain doping region respectively correspond to a source electrode and a drain electrode. The source electrode and the drain electrode formed in the semiconductor 130 may be formed by doping only the corresponding regions. In addition, a source electrode and a drain electrode in a region between a source electrode and a drain electrode of different transistors may be electrically connected to each other.

As shown in FIG. 4, a channel (or channels) 131 includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, a light emission control channel 131f formed in the light emission control transistor T6, and a bypass channel 131g formed in the bypass transistor T7.

The driving transistor T1 includes the driving channel 131a, a driving gate electrode 125a, a driving source electrode 176a, and a driving drain electrode 177a. The driving channel 131a is curved and may have an oblique shape or a zigzag shape. As such, the curved driving semiconductor layer 131a is formed, and thus the driving semiconductor layer 131a may be elongated in a narrow space. Thus, a driving range of a gate voltage applied to the driving gate electrode 125a is widened by the elongated driving channel 131a. Accordingly, since the driving range of a gate voltage is increased, a gray of light emitted from the organic light emitting diode OLED may be more finely controlled by changing a magnitude of the gate voltage, thereby enhancing resolution of the organic light emitting diode display and improving display quality. The shape of such a driving semiconductor layer 131a is variously modified, and thus various exemplary embodiments such as 'reverse S', 'S', 'M', 'W', and/or the like are possible.

The driving gate electrode 125a overlaps the driving channel 131a, and the driving gate electrode 125a is formed on the same layer with the same or substantially the same material as the scan line 121, the previous scan line 122, the emission control line 123, a switching gate electrode 125b, a compensation gate electrode 125c, an initialization gate electrode 125d, an operation control gate electrode 125e, and an emission control gate electrode 125f. The driving source electrode 176a and the driving drain electrode 177a do not overlap the driving channel 131a.

The switching transistor T2 includes the switching channel 131b, a switching gate electrode 125b, a switching source electrode 176b, and a switching drain electrode 177b. The switching gate electrode 125b, which is an expanded part of the scan line 121, overlaps the switching channel 131b. The switching source electrode 176b and the switching drain electrode 177b do not overlap the switching channel 131b. The switching source electrode 176b is connected with the data line 171 through a contact hole 62.

The compensation transistor T3 includes the compensation channel 131c, the compensation gate electrode 125c, a compensation source electrode 176c, and a compensation drain electrode 177c. The compensation gate electrode 125c, which is an expanded part protruding upward from the scan line 121, overlaps the compensation channel 131c. The compensation source electrode 176c and the compensation drain electrode 177c do not overlap the compensation channel 131c. The compensation drain electrode 177c is connected with a first data connection member 174 through a contact hole 63.

The initialization transistor T4 includes the initialization channel 131d, the initialization gate electrode 125d, an initialization source electrode 176d, and an initialization drain electrode 177d. Two initialization gate electrodes 125d, each of which is a part of the previous scan line 122, are provided for prevention of a leakage current and to overlap the initialization channel 131d. The initialization source electrode 176d and the initialization drain electrode 177d do not overlap the initialization channel 131d. The initialization source electrode 176d is connected with a second data connection member 175 through a contact hole 64.

The operation control transistor T5 includes the operation control channel 131e, the operation control gate electrode 125e, an operation control source electrode 176e, and an operation control drain electrode 177e. The operation control gate electrode 125e, which is a part of the light emission control line 123, overlaps the operation control channel 131e, and does not overlap the operation control source electrode 176e or the operation control drain electrode 177e. The operation control source electrode 176e is connected with an expanded part of the driving voltage line 172 through a contact hole 65.

The light emission control transistor T6 includes the light emission control channel 131f, the light emission gate electrode 125f, a light emission source electrode 176f, and a light emission drain electrode 177f. The light emission gate electrode 125f, which is a part of the light emission control line 123, overlaps the light emission control channel 131f and does not overlap the light emission source electrode 176f or the light emission drain electrode 177f. The light emission drain electrode 177f is connected with a third data connection member 179 through a contact hole 66.

The bypass thin film transistor T7 includes the bypass channel 131g, a bypass gate electrode 125g, a bypass source electrode 176g, and a bypass drain electrode 177g. The bypass gate electrode 125g, which is a part of the bypass control line 128, overlaps the bypass channel 131g and does not overlap the bypass source electrode 176g or the bypass drain electrode 177g. The bypass source electrode 176g is directly connected with the light emission drain electrode 177f and the bypass drain electrode 177g is directly connected with the initialization source electrode 176d.

A first end of the driving channel 131a of the driving transistor T1 is connected with the switching drain electrode 177b and the operation control drain electrode 177e, and a second end of the driving channel 131a is connected with the compensation source electrode 176c and the light emission source electrode 176f.

The storage capacitor Cst includes a first storage capacitor plate 125a, a second storage capacitor plate 178, and a second insulating layer 142 located therebetween. The first storage capacitor plate 125a corresponds to the driving gate electrode 125a, and the second storage capacitor plate 178 is an expansion area of the first driving voltage line 172a and is formed in each pixel. Here, the second insulating layer 142 becomes a dielectric material, and charges changed in the capacitor Cst and a voltage between the two plates 125a and 178 determine storage capacitance. As described, the driving gate electrode 125a may be used as the first storage capacitor plate 125a so that enough space for forming the storage capacitor can be assured when space is reduced due to the driving channel 131a occupying a large area in the pixel.

The first storage capacitor plate 125a, which is the driving gate electrode 125a, is connected with the first data connecting member 174 through a contact hole 61. The first data connecting member 174 is formed almost in parallel (e.g., substantially in parallel) with, and at the same layer as, the data layer 171, and connects the driving gate electrode 125a and the compensation drain electrode 177c of the compensation transistor T3.

Thus, the storage capacitor Cst stores a voltage that corresponds to a difference between the driving voltage ELVDD transmitted to the second storage capacitor plate 178 through the first driving voltage line 172a and a gate voltage of the driving gate electrode 125a.

The second driving voltage line 172b may be connected to the first driving voltage lines 172a formed in pixels that are adjacent to each other, and the second driving voltage line 17b and the data line 171 are formed at the same layer and thus they cross each other. Thus, the data line 171 is divided into an upper data line 171a and a lower data line 171b in a portion crossing the second driving voltage line 172b so as to prevent a short-circuit between the second driving voltage line 172b and the data line 171. A first end of the upper data line 171a is connected with a pixel connecting member 193 through a contact hole 83, and a first end of the lower data line 171b facing the upper data line 171a is connected with the pixel connecting member 193 through a contact hole 84. The pixel connecting member 193 is formed of the same or substantially the same material, and at the same layer, as the pixel electrode 191.

The third data connecting member 179 is connected with the pixel electrode 191 through a contact hole 81, the second data connecting member 175 is connected with the initialization voltage line 192 through a contact hole 82, and the first end of each of the upper and lower data lines 171a and 171b are respectively connected with the pixel connecting member 193 through the contact holes 83 and 84.

Hereinafter, a cross-sectional structure of the organic light emitting diode display according to the exemplary embodiment of the present disclosure will be described in detail in the order of laminating (or stacking) with reference to FIG. 5 and FIG. 6.

A lamination structure (or stacked structure) of the operation control transistor T5 is almost the same as that of the light emission control transistor T6, and therefore description thereof will be omitted.

A buffer layer 120 may be formed on a substrate 110. The substrate 110 may be an insulation substrate made of an insulation material such as glass, quartz, ceramic, plastic, and/or the like, and the buffer layer 120 blocks an impurity from the substrate 110 during a crystallization process for forming a polycrystalline semiconductor to improve a feature of the polycrystalline semiconductor and may reduce stress applied to the substrate 110.

The semiconductor 130 includes the driving channel 131a, the switching channel 131b, the compensation channel 131c, the initialization channel 131d, the operation control channel 131e, and the light emission control channel 131f, and is formed on the buffer layer 120. The driving source electrode 176a and the driving drain electrode 177a are provided at respective sides of the driving channel 131a, the switching source electrode 176b and the switching drain electrode 177b are provided at respective sides of the switching channel 131b, the compensation source electrode 176c and the compensation drain electrode 177c are provide at respective sides of the compensation channel 131c, the initialization source electrode 176d and the initialization drain electrode 177d are provided at respective sides of the initialization channel 131d, the operation control source electrode 176e and the operation control drain electrode 177e are provided at respective sides of the operation control channel 131e, and the light emission source electrode 176f and the light emission drain electrode 177f are provided at respective sides of the light emission control channel 131f.

A first insulating layer 141 covering the semiconductor 130 is formed on the semiconductor. The gate wires 121, 122, 123, 125a, 125b, 125c, 125d, 125e, and 125f are formed on the first insulating layer 141. The gate wires include the scan line 121 which includes the switching gate electrode 125b and the compensation gate electrode 125c, the previous scan line 122 which includes the initialization gate electrode 125d, the light emission control line 123 which includes the operation control gate electrode 125e and the light emission control gate electrode 125f, and the driving gate electrode (i.e., the first storage capacitor plate 125a).

The second insulating layer 142 is formed to cover the gate wires 121, 122, 123, 125a, 125b, 125c, 125d, 125e, and 125f and the first insulating layer 141. The first insulating layer 141 and the second insulating layer 142 may be made of a silicon nitride (SiNx) or a silicon oxide (SiO$_x$).

Data wires 171, 172a, 172b, 174, 175, 178, and 179 are formed on the second insulating layer 142. The data wires include the data line 171, the first driving voltage line 172a, and the second driving voltage line 172b which includes the second storage capacitor plate 178, the second insulating layer 142, the first data connecting member 174, the second data connecting member 175, and the third data connecting member 179.

The data wires 171, 172a, 172b, 174, 175, 178, and 179 may be formed of a triple-layer of titanium/aluminum/titanium (Ti/Al/Ti), and because aluminum is a low-resistive metal, a voltage drop can be prevented or reduced.

As described, the second storage capacitor plate 178 is formed of the same or substantially the same material, and at the same layer as, the second driving voltage line 172b and the data line 171, and therefore there is no need to form the second storage capacitor layer in an additional layer, thereby reducing the number of masks used in a manufacturing process. In addition, the second storage capacitor plate 178, the second driving voltage line 172b, and the data line 171 are formed at the same layer, and therefore no additional insulating layer for insulation of the second storage capacitor plate 178, the second driving voltage line 172b, and the data line 171 is needed, and a short-circuit between the second storage capacitor plate 178, the second driving voltage line 172b, and the data line 171 can be fundamentally or substantially prevented.

The data line 171 is connected with the switching source electrode 176b through the contact hole 62 formed in the first insulating layer 141 and the second insulating layer 142, the second data connecting member 175 is connected with the initialization drain electrode 177d through the contact hole 64 formed in the first insulating layer 141 and the second insulating layer 142, and the third data connecting member 179 is connected with the light emission control drain electrode 177f through the contact hole 66 formed in the first insulating layer 141 and the second insulating layer 142.

A passivation layer 180 is formed on the data wires 171, 172a, 172b, 174, 175, 178, and 179, as well as the second insulating layer 142, for protection thereof. The passivation layer 180 may be formed of an organic layer. The pixel electrode 191, the pixel connecting member 192, and the initialization voltage line 193 may be formed on the passivation layer 180. The quadrangular-shaped third data connecting member 179 is connected with the pixel electrode 191 through the contact hole 81 formed in the passivation layer 180, and the quadrangular-shaped second data connecting member 175 is connected with the initialization voltage line 192 through the contact hole 82 formed in the passivation layer 180. The first end of the upper data line 171a is connected with a first end of the pixel connecting member 193 through the contact hole 83 formed in the passivation layer, and the first end of the lower data line 171b is connected with a second end of the pixel connection member 193 through the contact hole 84 formed in the passivation layer 180.

As described, the data line 171 is divided into the upper data line 171a and the lower data line 171b at the crossing portion where the data line 171 and the second driving voltage line 172b formed at the same layer cross each other so as to prevent an occurrence of a short-circuit therebetween in the crossing portion, and the divided upper and lower data lines 171a and 171b are connected with each other through the pixel connecting member 193 such that the data line 171 and the second driving voltage line 172b can be formed at the same layer. Thus, the first driving voltage line 172 in a vertical direction and the second driving voltage line 172b in a horizontal direction are connected with each other such that a mesh structure can be formed, and accordingly a voltage drop of the driving voltage ELVDD can be prevented or reduced.

A side wall 350 covering the passivation layer 180, the initialization voltage line 192, the pixel connecting member 193, and the pixel electrode 191 is formed on the passivation layer 180, the initialization voltage line 192, the pixel connecting member 193, and an edge of the pixel electrode 191. The side wall 350 includes a side wall opening 351 that exposes the pixel electrode 191. The side wall 350 may be made of a resin such as a polyacrylate resin and a polyimide, or a silica-based inorganic material.

The organic emission layer 370 is formed on the pixel electrode 191 exposed by the side wall 351, and the common electrode 270 is formed on the organic emission layer 370. As described, the organic light emitting diode OLED including the pixel electrode 191, the organic emission layer 370, and the common electrode 270 may be formed.

Here, the pixel electrode 191 becomes an anode, which is a hole injection electrode, and the common electrode 270 becomes a cathode, which is an electron injection electrode. However, the exemplary embodiment of the present disclosure is not limited thereto, and according to a driving method of the organic light emitting device, the pixel electrode 191 may be a cathode and the common electrode 270 may be an anode. The hole and electron are injected into the organic emission layer 370 from the pixel electrode 191 and the common electrode 270, respectively, and an exciton generated by coupling the injected hole and electron falls from an excited state to a ground state to emit light.

The organic emission layer 370 is made of a low-molecular organic material or a high-molecular organic material such as poly(3,4-ethylenedioxythiophene) (PEDOT). Further, the organic emission layer 370 may be formed as a multilayer including an emission layer, and may include one or more of a hole injection layer (HIL), a hole transporting layer (HTL), an electron transporting layer (ETL), and an electron injection layer (EIL). In the case where the organic emission layer 370 includes all the layers, the hole injection layer (HIL) is disposed on the pixel electrode 191 which is an anode, and the hole transporting layer (HTL), the emission layer, the electron transporting layer (ETL), the electron injection layer (EIL) are sequentially laminated (or stacked) thereon.

The organic emission layer 370 may include a red organic emission layer for emitting red light, a green organic emission layer for emitting green light, and a blue organic emission layer for emitting blue light. The red organic emission layer, the green organic emission layer, and the blue organic emission layer are formed in a red pixel, a green pixel, and a blue pixel, respectively, thereby implementing a color image.

Further, the organic emission layer 370 may implement the color image by laminating (or stacking) the red organic emission layer, the green organic emission layer, and the blue organic emission layer together in the red pixel, the green pixel, and the blue pixel, and forming a red color filter, a green color filter, and a blue color filter for each pixel. As another example, white organic emission layers for emitting white light may be formed in all of the red pixel, the green pixel, and the blue pixel, and a red color filter, a green color filter, and a blue color filter are formed for each pixel, thereby implementing the color image. In the case of implementing the color image by using the white organic emission layer and the color filters, a deposition mask for depositing the red organic emission layer, the green organic emission layer, and the blue organic emission layer on respective pixels, that is, the red pixel, the green pixel, and the blue pixel, does not need to be used.

The white organic emission layer described in another example may be formed by one organic emission layer, or may have a configuration in which a plurality of organic emission layers are laminated (or stacked) so as to emit white light. For example, the white organic emission layer may include a configuration which may emit white light by combining at least one yellow organic emission layer and at least one blue light emitting layer, a configuration which may emit white light by combining at least one cyan organic emission layer and at least one red light emitting layer, a configuration which may emit white light by combining at least one magenta organic emission layer and at least one green light emitting layer, and/or the like.

An encapsulation member for protecting the organic light emitting diode OLED may be formed on the common electrode 270, and the encapsulation member may be encapsulated on the substrate 110 by a sealant, and may be made of various suitable materials such as glass, quartz, ceramic, plastic, and metal. Further, a thin film encapsulation layer may be formed by depositing an inorganic layer and an organic layer on the common electrode 270 without using the sealant.

Hereinafter, a method for manufacturing an organic light emitting display device according to an exemplary embodiment of the present disclosure will be described with reference to the accompanying drawings.

Figure 7:
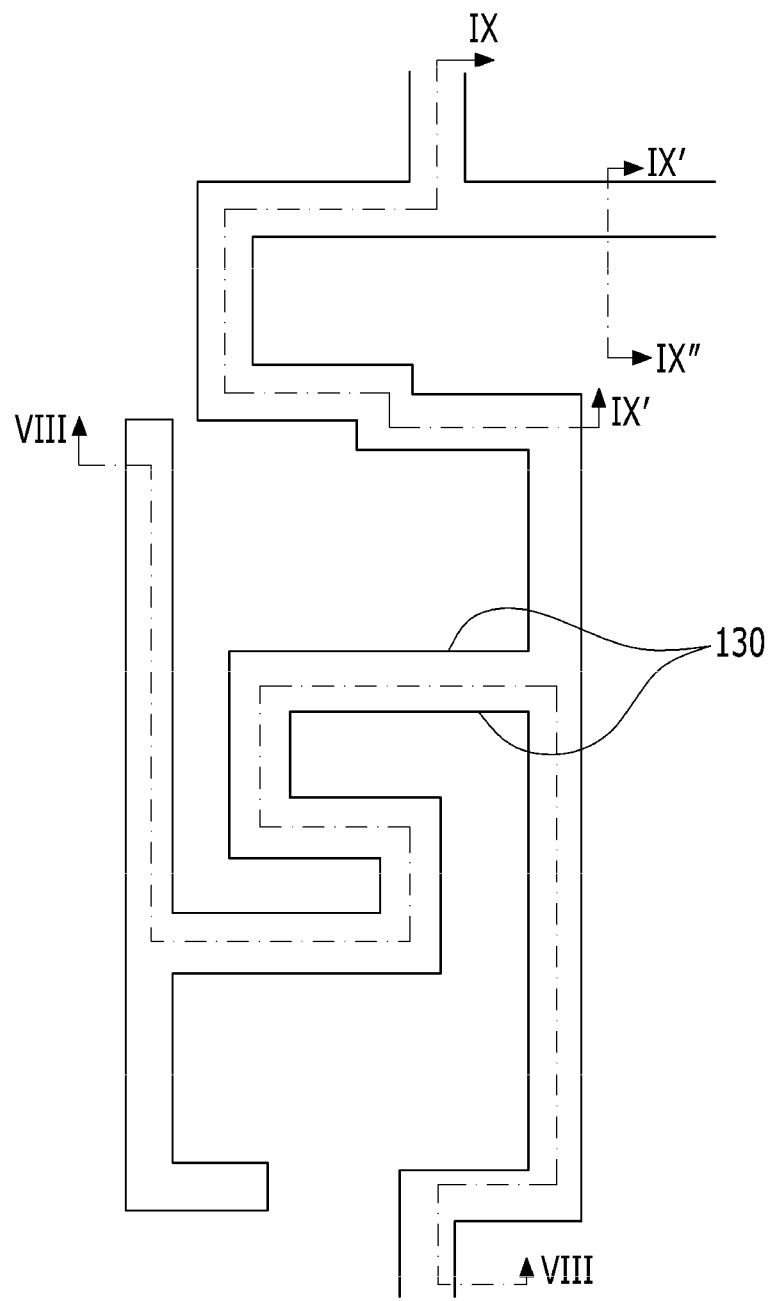
FIG. 7 is a layout view of a manufacturing method of the organic light emitting display device according to an exemplary embodiment of the present disclosure.
Figure 8:
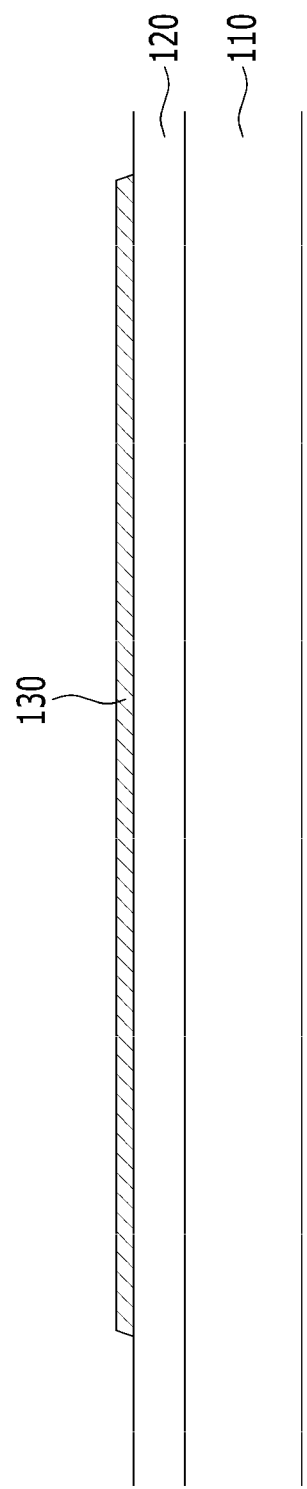
FIG. 8 is a cross-sectional view of the organic light emitting display device of FIG. 7, taken along the line VIII-VIII.
Figure 9:
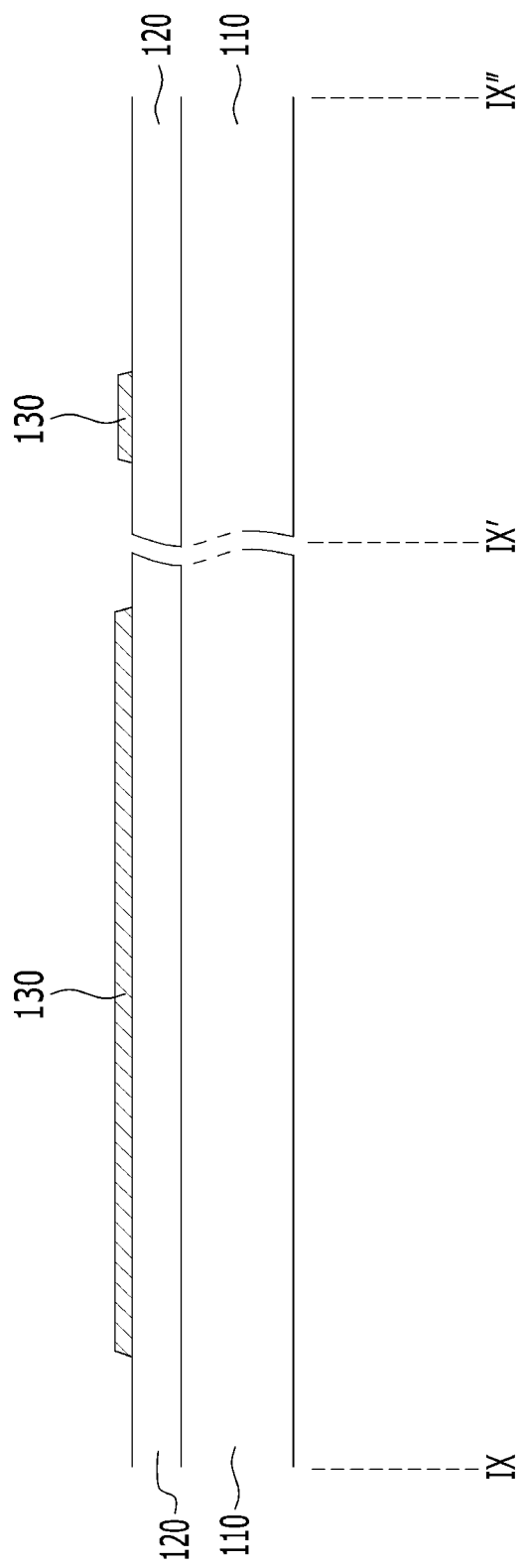
FIG. 9 is a cross-sectional view of the organic light emitting display device of FIG. 7, taken along the lines IX-IX' and IX'-IX".
Figure 10:
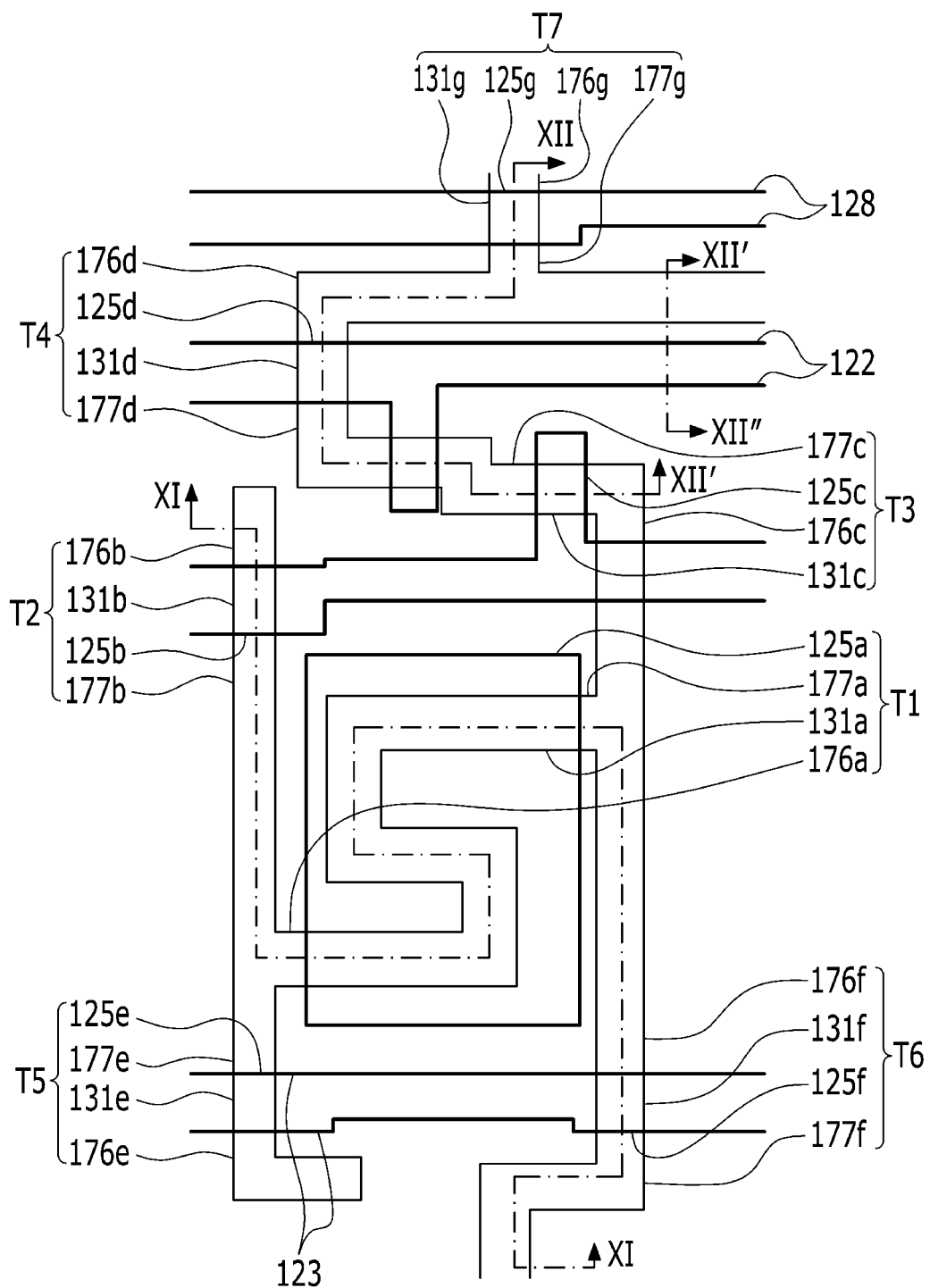
FIG. 10 is a layout view of a manufacturing method of the organic light emitting display device according to an exemplary embodiment of the present invention.
Figure 11:
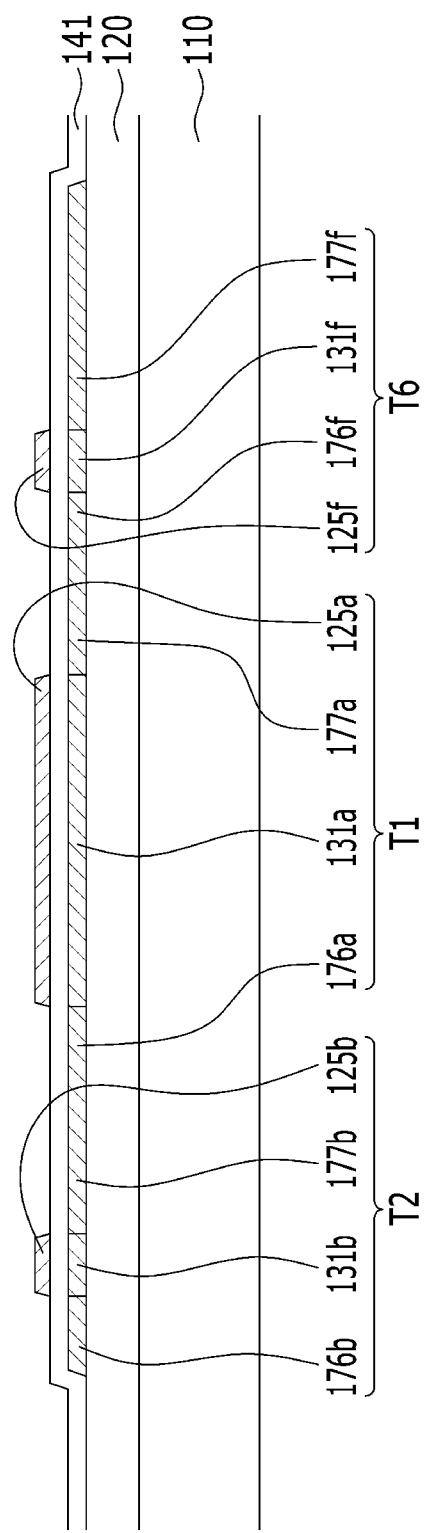
FIG. 11 is a cross-sectional view of the organic light emitting display device of FIG. 10, taken along the line XI-XI.
Figure 12:
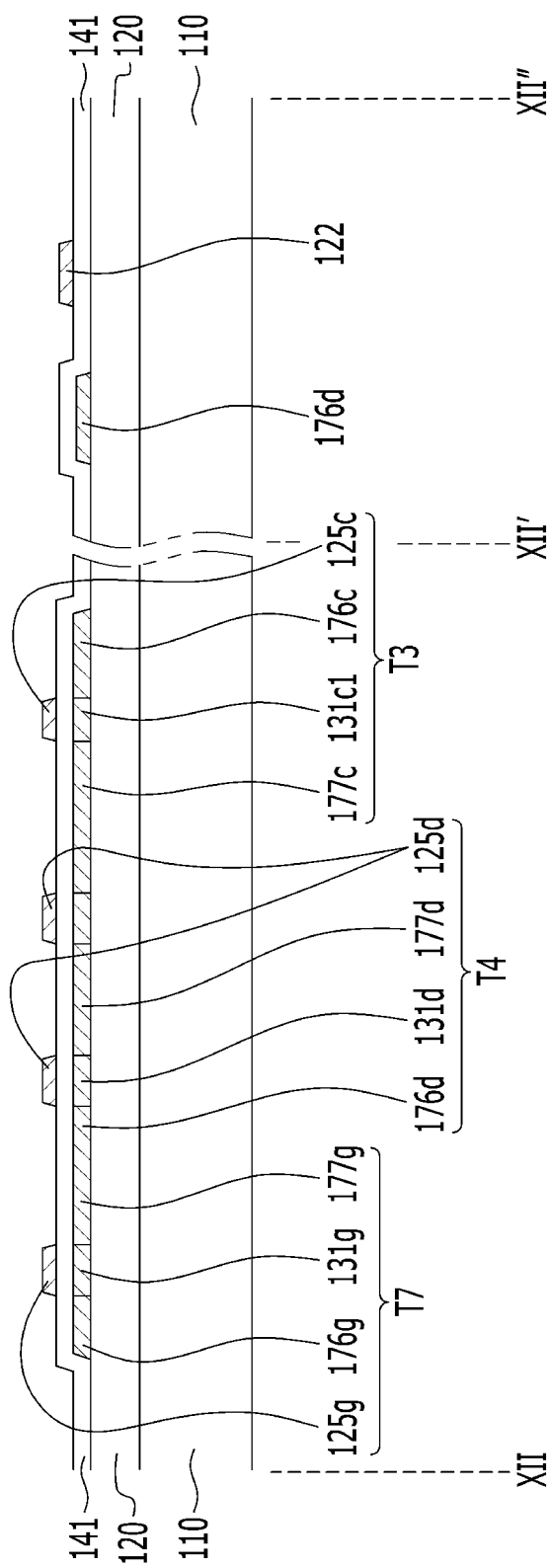
FIG. 12 is a cross-sectional view of the organic light emitting display device of FIG. 10, taken along the lines XII-XII' and XII'-XII".
Figure 13:
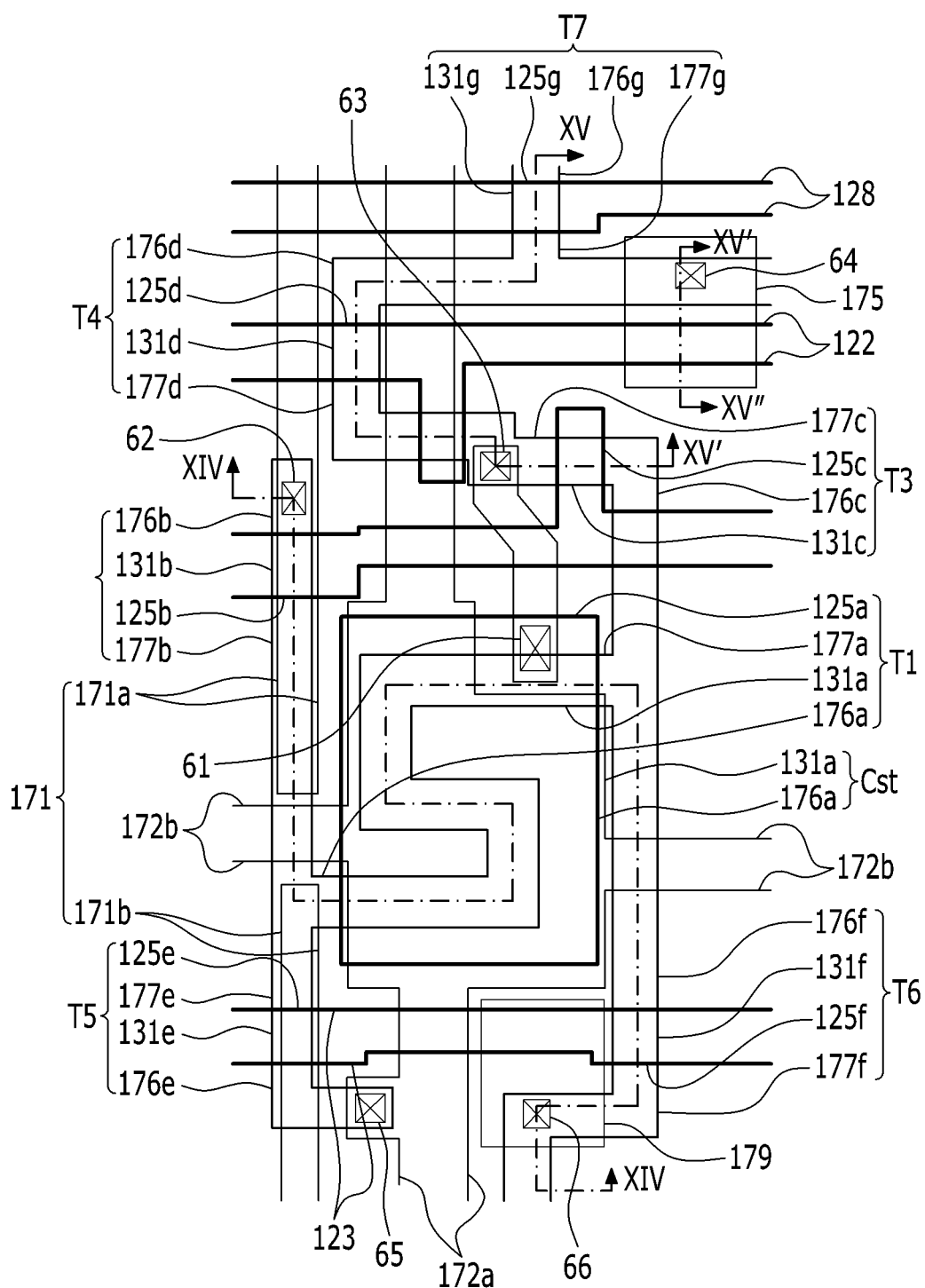
FIG. 13 is a layout view of a manufacturing method of the organic light emitting display device according to an exemplary embodiment of the present invention.
Figure 14:
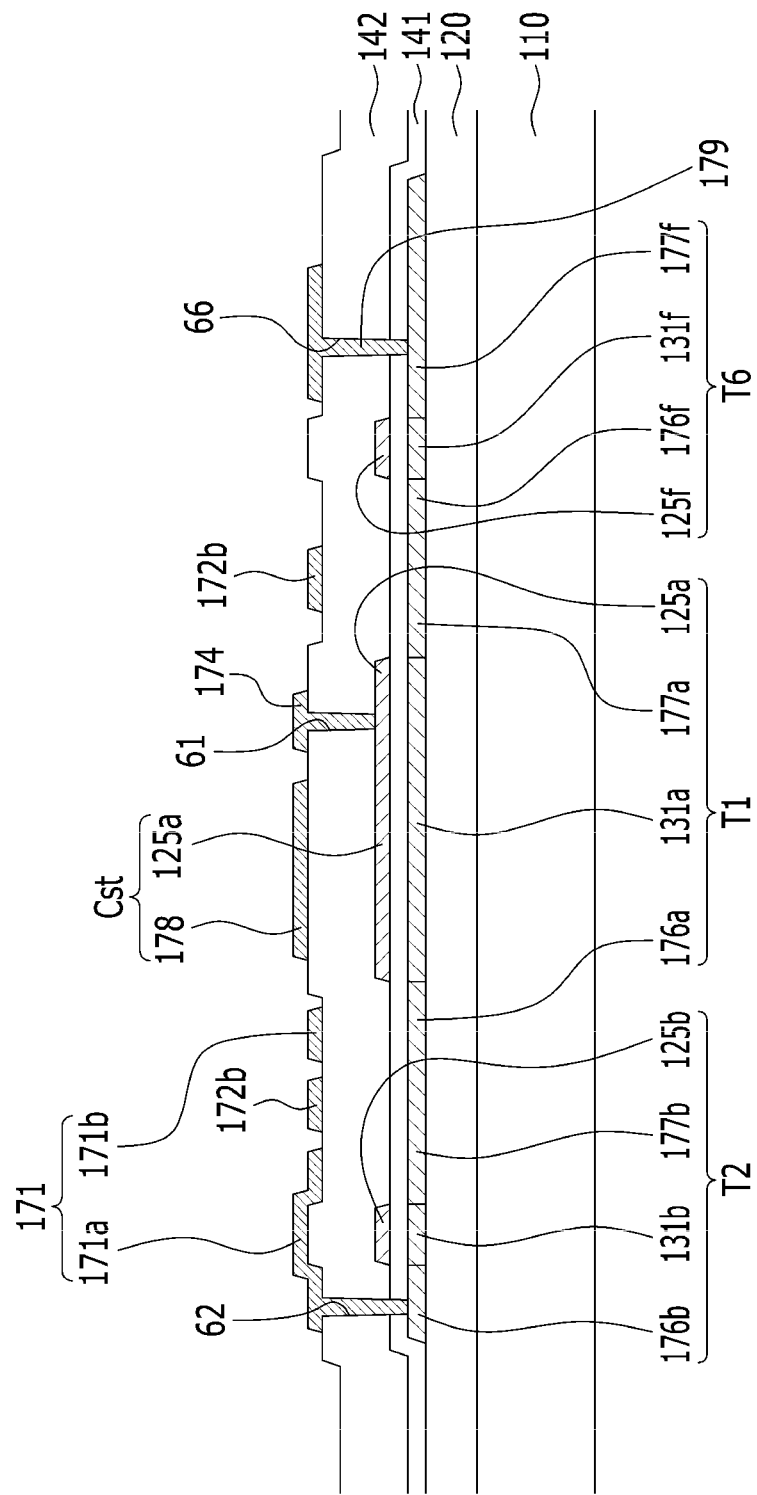
FIG. 14 is a cross-sectional view of the organic light emitting display device of FIG. 13, taken along the line XIV-XIV.
Figure 15:
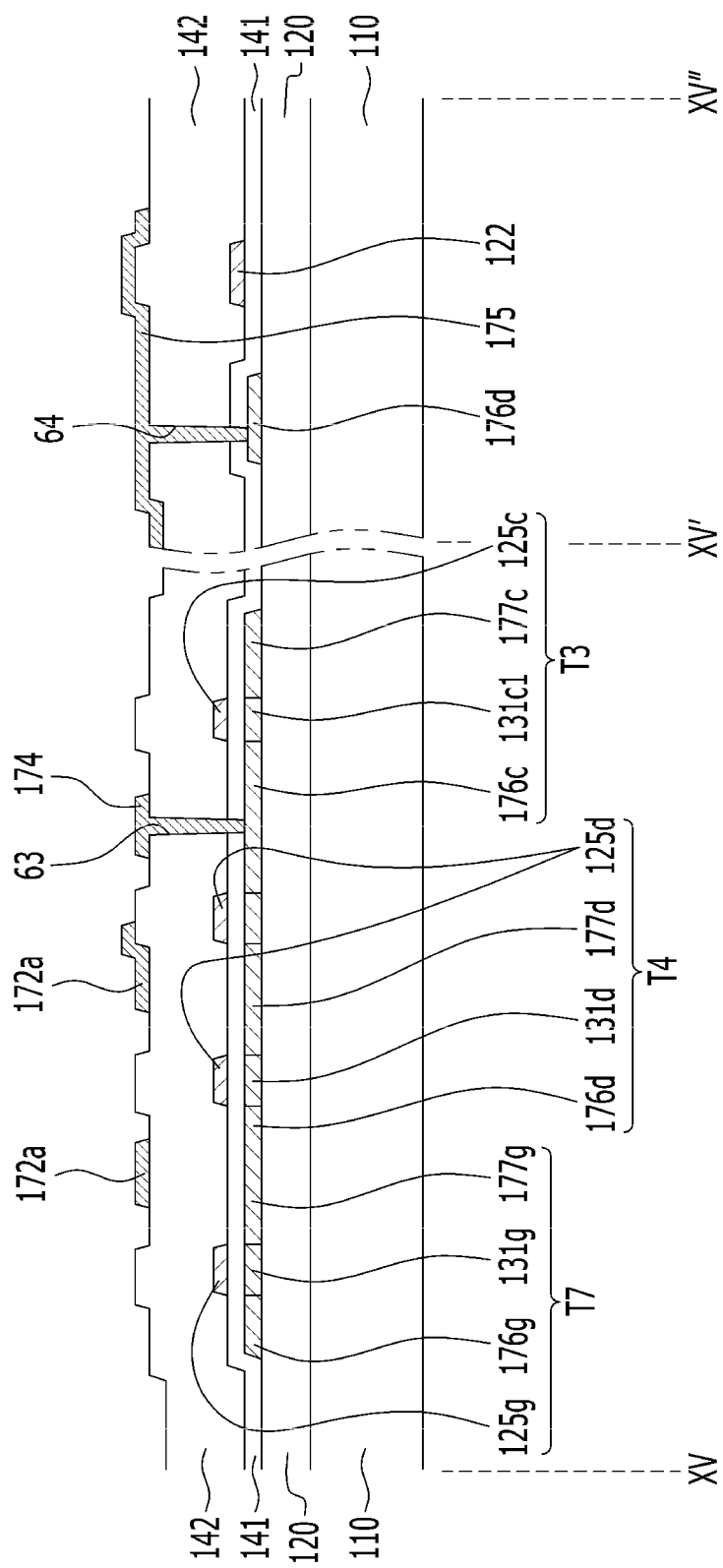
FIG. 15 is a cross-sectional view of the organic light emitting display device of FIG. 13, taken along the lines XV-XV' and XV-XV".

FIG. 7, FIG. 10, and FIG. 13 are sequential layout views of a manufacturing method of an organic light emitting display device according to an exemplary embodiment of the present disclosure, FIG. 8 is a cross-sectional view of the organic light emitting display device of FIG. 7, taken along the line VIII-VIII, FIG. 9 is a cross-sectional view of the organic light emitting display device of FIG. 7, taken along the line IX-IX, FIG. 11 is a cross-sectional view of the organic light emitting display device FIG. 10, taken along the line XI-XI, FIG. 12 is a cross-sectional view of the organic light emitting display device of FIG. 10, taken along the lines XII-XII' and XII'-XII", FIG. 14 is a cross-sectional view of the organic light emitting display device of FIG. 13, taken along the line XIV-XIV, and FIG. 15 is a cross-sectional view of the organic light emitting display device of FIG. 13, taken along the lines XV-XV' and XV-XV".

First, as shown in FIG. 7 through FIG. 9, a buffer layer 120 is formed on a substrate 110. The buffer layer 120 may be formed as a single layer of a silicon nitride or a dual layer structure in which a silicon nitride and a silicon oxide are laminated (or stacked), and is deposited to the entire surface on the substrate 110 using a plasma enhanced chemical vapor deposition (PECVD) method and/or the like. In addition, a semiconductor layer 130 is formed on the buffer layer 120. The semiconductor 130 may be formed of a polycrystalline semiconductor layer or an oxide semiconductor layer, and the polycrystalline semiconductor layer may be formed by forming an amorphous silicon layer and then crystallizing the amorphous silicon layer. Various suitable known methods may be applied as a crystallization method, and the amorphous silicon layer may be crystallized using, for example, heat, laser, Joule heat, an electric field, or a catalyst metal. In addition, a photolithography process is performed using a first mask on the polycrystalline semiconductor layer such that the polycrystalline layer is patterned to a semiconductor 130 having a shape shown in FIG. 7. The semiconductor 130 has not yet been doped and thus is not divided into a channel, a source electrode, and a drain electrode forming each transistor.

Next, as shown in FIG. 10 through FIG. 12, a first insulating layer 141 covering the buffer layer 120 and the semiconductor 130 is formed on the buffer layer 120 and the semiconductor 130. The first insulating layer 141 is formed by wholly depositing a silicon nitride (SiNx) or a silicon oxide (SiO$_x$) using a PECVD method and/or the like. In addition, a gate metal layer is deposited to the first insulating layer 141. In addition, the gate metal layer is patterned through a photolithography process using the second mask. Thus, gate wires including a scan line 121, a previous scan line 122, a light emission control line 123, a bypass control line 128, and a driving gate electrode 125 are formed. The gate metal layer may be made of a multi-layer of a metal layer including at least one of copper (Cu), a copper alloy, aluminum (Al), and an aluminum alloy, and a metal layer including at least one of molybdenum (Mo) and a molybdenum alloy.

In addition, an impurity is doped to the semiconductor 130. The semiconductor 130 is doped with the impurity, excluding portions respectively covered by a switching gate electrode 125b, a compensation gate electrode 125c, an initialization gate electrode 125d, an operation control gate electrode 125e, a light emission gate electrode 125f, a bypass gate electrode 125g, and a driving gate electrode 125a. Thus, a source electrode and a drain electrode of each transistor are formed. A channel of each transistor is formed in the area which is not doped by being covered by the semiconductor 130. That is, a driving channel 131a, a switching channel 131b, a compensation channel 131c, an initialization channel 131d, an operation control channel 131e, a light emission control channel 131f, and a bypass channel 131g are concurrently (e.g., simultaneously) formed. As described, no additional mask is required in doping of the semiconductor 130.

Next, as shown in FIG. 13 through FIG. 15, a second insulating layer 142 is formed to cover the first insulating layer 141, the scan line 121, the previous scan line 122, the light emission control line 123, the bypass control line 128, and the driving gate electrode 125. The first insulating layer 141 is formed by wholly depositing a silicon nitride (SiNx) or a silicon oxide (SiO$_x$) using a PECVD method and/or the like. In addition, a dopant activation process is performed to make the impurity doped in the semiconductor 130 settle therein, and damage to an interface between the semiconductor 130 and the first insulating layer 141 is eliminated.

In addition, a plurality of contact holes 61, 62, 63, 64, 64, 65, and 66 are formed by patterning the first insulating layer 141 and the second insulating layer 142 through a photolithography process using a third mask. A data metal layer is formed on the second insulating layer 142. The data metal layer may be formed of a multi-layer of a metal layer including at least one of copper, a copper alloy, aluminum, and an aluminum alloy, and a metal layer including at least one of molybdenum and a molybdenum alloy. For example, the data metal layer may be formed of a triple-layer of titanium/aluminum/titanium (Ti/Al/Ti) or a triple-layer of molybdenum/copper/molybdenum(Mo/Cu/Mo).

The data metal layer is patterned through a photolithography process using a fourth mask. Thus, data wires including the data line 171, the first driving voltage line 172a including the second storage capacitor plate 178, the second driving voltage line 172b, a first data connecting member 174, a second data connecting member 175, and a third data connecting member 179 are formed on the second insulating layer. As described, the second storage capacitor plate 178 is made of the same or substantially the same material at the same layer as the second driving voltage line 172b and the data line 171 such that the second storage capacitor plate is not formed in an additional layer, thereby reducing the number of masks used in the manufacturing process. In addition, the second storage capacitor plate 178, the second driving voltage line 172b, and the data line 171 are formed at the same layer, and therefore an additional insulating layer for insulation between the second storage capacitor plate 178, the second driving voltage line 172b, and the data line 171 is not needed and a short-circuit between the second storage capacitor plate 178, the second driving voltage line 172b, and the data line 171 can be fundamentally or substantially prevented.

Next, as shown in FIG. 4 through FIG. 6, a passivation layer 180 covering the data wires 171, 172, 174, 175, 178, and 179 is formed on the second insulating layer 142, and contact holes 81, 82, 83, and 83 are formed in the passivation layer 180 through a photolithography process using a fifth mask. In addition, a pixel electrode layer is formed on the passivation layer 180 and the pixel electrode layer is patterned through a photolithography process using a sixth mask. Thus, a pixel electrode 191 connected with the third data connecting member 179 through the contact hole 81, an initialization voltage line 192 connected with the second data connecting member 175 through the contact hole 82, and a pixel connecting member 193 connecting a first end and a second end of the separated data line 171 through the contact holes 83 and 84 are formed. In addition, a side wall 350 covering the initialization voltage line 192 and the pixel connecting member 193 is formed on the passivation layer 180, and a side wall opening 351 that partially exposes the pixel electrode 191 is formed in the side wall 350 using a seventh mask. In addition, an organic emission layer 370 is formed on the pixel electrode 191 exposed through the side wall opening 351 of the side wall 350. Then, a common electrode 270 is formed on the organic emission layer 370 such that an organic light emitting element 70 is formed. The common electrode 270 is formed throughout the entire area, excluding above the side wall 350 so that no additional mask is used.

While this disclosure has been described in connection with what is presently considered to be practical exemplary embodiments, it is to be understood that the present disclosure is not limited to the disclosed embodiments, but, on the contrary, is intended to cover various modifications and equivalent arrangements included within the spirit and scope of the appended claims and their equivalents.

| Description of some of the symbols | |
|---|---|
| 121: scan line | 122: previous scan line |
| 123: light emission control line | 124: initialization voltage line |
| 125a: driving gate electrode | 125b: switching gate electrode |
| 131a: driving channel | 131b: switching channel |
| 141: first insulating layer | 142: second insulating layer |
| 171: data line | 171a: upper data line |
| 171b: lower data line | 172: driving voltage line |
| 172a: first driving voltage line | 172b: second driving voltage line |
| 180: passivation layer | 191: pixel electrode |
| 192: initialization voltage line | 193: pixel connecting member |
| 270: common electrode | 370: organic emission layer |

What is claimed is:

1. A method of manufacturing an organic light emitting display device, comprising:
    forming a semiconductor on a substrate;
    forming a first insulating layer covering the semiconductor;
    forming a driving gate electrode of a driving transistor and a switching gate electrode of a switching transistor on the first insulating layer;
    forming a driving channel and a switching channel respectively in the semiconductor provided below the driving gate electrode and the switching gate electrode by performing a doping process;
    forming a second insulating layer covering the driving gate electrode and the switching gate electrode;
    forming a data line comprising:
        an upper data line; and
        a lower data line that is spaced from the upper data line;

forming a first driving voltage line that is parallel with the data line, the first driving voltage line being formed on and contacting an upper surface of the second insulating layer;

forming a second driving voltage line that crosses the data line, the second driving voltage line being formed on and contacting the upper surface of the second insulating layer;

forming a passivation layer covering the data line, the first driving voltage line, and the second driving voltage line; and forming a pixel electrode and a pixel connecting member on the passivation layer, wherein the pixel connecting member connects the upper data line and the lower data line to each other, wherein the upper data line and the lower data line are formed on and contacting the upper surface of the second insulating layer, and wherein the first driving voltage line, the second driving voltage line, the upper data line, and the lower data line are formed on the same layer.

2. The method for manufacturing the organic light emitting display device of claim 1, wherein a storage capacitor is in an area where the driving gate electrode and an expanded area of the first driving voltage line overlap each other.

3. The method for manufacturing the organic light emitting display device of claim 2, wherein the driving channel comprises at least one curved portion.

4. The method for manufacturing the organic light emitting display device of claim 3, further comprising performing a dopant activation process to the semiconductor after forming the second insulating layer.

5. The method for manufacturing the organic light emitting display device of claim 3, further comprising:

forming an organic emission layer on the pixel electrode; and forming a common electrode on the organic emission layer.

\* \* \* \* \*